United States Patent [19]
Swales

[11] Patent Number: 5,978,662
[45] Date of Patent: Nov. 2, 1999

[54] CIRCUIT ARRANGEMENT COMPRISING A CARTESIAN AMPLIFIER

[75] Inventor: Nicholas D. Swales, Hardwick, United Kingdom

[73] Assignee: U.S. Philips Corporation, New York, N.Y.

[21] Appl. No.: 08/882,872

[22] Filed: Jun. 26, 1997

[30] Foreign Application Priority Data

Jun. 28, 1996 [EP] European Pat. Off. .............. 96110467

[51] Int. Cl.$^6$ .................................................. H01Q 11/12
[52] U.S. Cl. ........................................... 455/126; 455/119
[58] Field of Search ................................... 455/126, 110, 455/119, 113, 112

[56] References Cited

U.S. PATENT DOCUMENTS 5,802,451  9/1998  Adachi et al. ........................... 455/126

*Primary Examiner*—Reinhard J. Eisenzopf
*Assistant Examiner*—Raymond B. Persino
*Attorney, Agent, or Firm*—Dicran Halajian

[57] ABSTRACT

A circuit having a Cartesian amplifier is disclosed. The Cartesian amplifier includes a re-combining stage which re-combines an input signal from a signal source with a correction signal to output a result signal. A first mixer mixes the result signal with a first oscillating signal from a local oscillator. A power amplifier amplifies the mixed signal and a coupler couples part of the amplified signal to form an outcoupling signal. A feedback path has a second mixer for forming the correction signal by mixing the outcoupling signal with a second oscillating signal from the local oscillator. An envelope curve detector detects the envelope of the amplified signal to produce an envelope signal, and a phase adjustor adjusts the phase of the first or second oscillating signal. A control circuit is provided to control the phase errors in a phase locked loop of the Cartesian amplifier and to minimized the envelope signal. The control circuit receives the envelop signal and has an adjustment output for providing an adjusting signal to the phase adjustor. The control circuit further has a modulation output to produce a measuring oscillation signal. A modulation stage modulates the phase position of one of the oscillating signals with the measuring oscillation signal.

8 Claims, 4 Drawing Sheets

CIRCUIT ARRANGEMENT COMPRISING A CARTESIAN AMPLIFIER

BACKGROUND OF THE INVENTION

The invention relates to a circuit arrangement comprising a Cartesian amplifier, including
- a signal source for producing an input signal,
- a re-combining stage for forming a result signal by re-combining the input signal and a correction signal,
- a first mixer stage for mixing the result signal with a first oscillation of the local oscillator,
- a power amplifier stage for amplifying the signal produced by the first mixer stage,
- a coupler for coupling out part of the output signal of the power amplifier stage as an outcoupling signal,
- a feedback path comprising a second mixer stage for deriving the correction signal from the outcoupling signal by mixing the outcoupling signal with a second oscillator of the local oscillator,
- an envelope curve detection stage for producing an envelope curve signal which corresponds to the envelope curve of the output signal of the power amplifier stage,
- and a phase adjustment stage for adjusting the phase position of at least one of the oscillations of the local oscillator.

The invention further relates to a transmitter apparatus comprising a circuit arrangement of said type and to mobile radio equipment comprising such a transmitter apparatus.

Such a Cartesian amplifier is known from European Patent Application 598 585. In that Application, an input signal is preprocessed and split into two mutually orthogonal signal components (quadrature components). The two quadrature components are passed, in parallel, through associated signal paths of an error amplifier, after whey they are re-combined and up-converted to a RF band. The output signal of the amplifier is utilized to provide a feedback signal. This feedback signal is down-converted from the high-frequency band to the baseband and resolved into two quadrature components. These quadrature components are fed to respective inputs of the error amplifier. The preprocessor for the input signal is periodically switched into a calibration mode in which test signals are applied to the amplifier instead of the input signal. At these times the signal strength of the output signal of the power amplifier is measured and used to provide predistortion factors in the signal preprocessor to improve amplifier linearity.

OBJECTS AND SUMMARY OF THE INVENTION

It is an object of the invention to provide a simple arrangement for an accurate control of phase errors in the Cartesian loop.

According to the invention this object is achieved with a circuit arrangement of the type defined in the opening paragraph, by
- a control circuit having
  - an input for receiving the envelope curve signal,
  - an adjustment output, from which an adjusting signal for adjusting the phase position of at least one of the oscillations of the local oscillator is applied to the phase adjustment stage, and
  - a modulation output for producing a measuring oscillation,
- and a modulation stage for modulating the phase position of one of the oscillations of the local oscillator with the measuring oscillation, which control circuit minimizes from the envelope curve signal the signal portion that results from the modulation with the measuring oscillation, by adjusting the phase position of at least one of the oscillations of the local oscillator by means of the adjusting signal.

Cartesian amplifiers are preferably used as power amplifiers in transmitter devices in which high linearity of the amplification is desired, to avoid distortions of the transmit signal. Such a transmitter device comprising a Cartesian amplifier or a Cartesian loop (so defined after the feedback of the quadrature components) is also shown in the document EP 0 598 585 A2. This Cartesian amplifier has, in essence, four important operating parameters: the phase of the feedback loop, the gain balance between the quadrature components, the quadrature error between the quadrature components, and the carrier remainder. These four operating parameters of the Cartesian amplifier can basically be measured with a single envelope curve detector (envelope curve rectifier) and controlled to achieve optimum operation. The envelope curve rectifier—with the object of the present invention, the envelope curve detector—is connected to the output of the transmitter or of the power amplifier used therein, whose characteristic is to be linearized. After respective filtering, the envelope curve signal delivered by the envelope curve detector represents a direct magnitude of the instantaneous amplitude of the envelope curve of the high-frequency oscillation produced by the power amplifier. Monitoring this envelope curve signal provides the possibility to measure aforesaid four operating parameters of the Cartesian amplifier and readjust them. For this purpose, the invention describes a highly simple and effective arrangement for controlling the phase of the feedback loop.

In a particular embodiment, the control circuit of the circuit arrangement according to the invention comprises a high-pass filter connected to its input for resolving the signal part from the envelope curve signal, which signal part results from the modulation with the measuring oscillation. This high-pass filter can suppress particularly a DC component in the envelope curve signal, thus making a precise evaluation possible of AC parts of the envelope curve signal, even when these AC parts have a smaller amplitude than the DC part.

Preferably, the control circuit comprises an analogue to digital converter for sampling the envelope curve signal. Generation of the measuring oscillation derivation of the adjusting signal may be done using a digital signal processor and a digital analogue converter.

According to another embodiment of the invention, the envelope curve signal is at the same time used for controlling the aforesaid further operating parameters, or adjusting operations for these operating parameters of the Cartesian amplifier. The use of the circuit arrangement according to the invention is then possible without additional circuitry and cost.

According to a further embodiment of the invention, the measuring oscillation is produced during a predefinable time interval in which the signal source produces an input signal with a predefined time variation, and, outside this time interval, the adjusting signal value reached in this same time interval is maintained by the control circuit. Preferably, one of the signal paths for one of the quadrature components in the Cartesian amplifier can be interrupted for this measurement. As a result, this signal path does not contribute to the signal amplified in the power amplifier. In the second signal path, an input signal having a constant value can be transmitted in this time interval. The optimum loop phase parameter is determined in said time interval and then retained by the control circuit at the next operation when a valid signal is transmitted through the Cartesian amplifier, so that optimum transmission conditions are achieved.

A circuit arrangement according to one of the embodiments of the invention may preferably be used in a transmitter apparatus and within mobile radio equipment comprising such a transmitter apparatus.

These and other aspects of the invention are apparent from and will be elucidated with reference to the embodiments described hereinafter.

DETAILED DESCRIPTION OF THE PREFERRED EMBODIMENT

Figure 1:
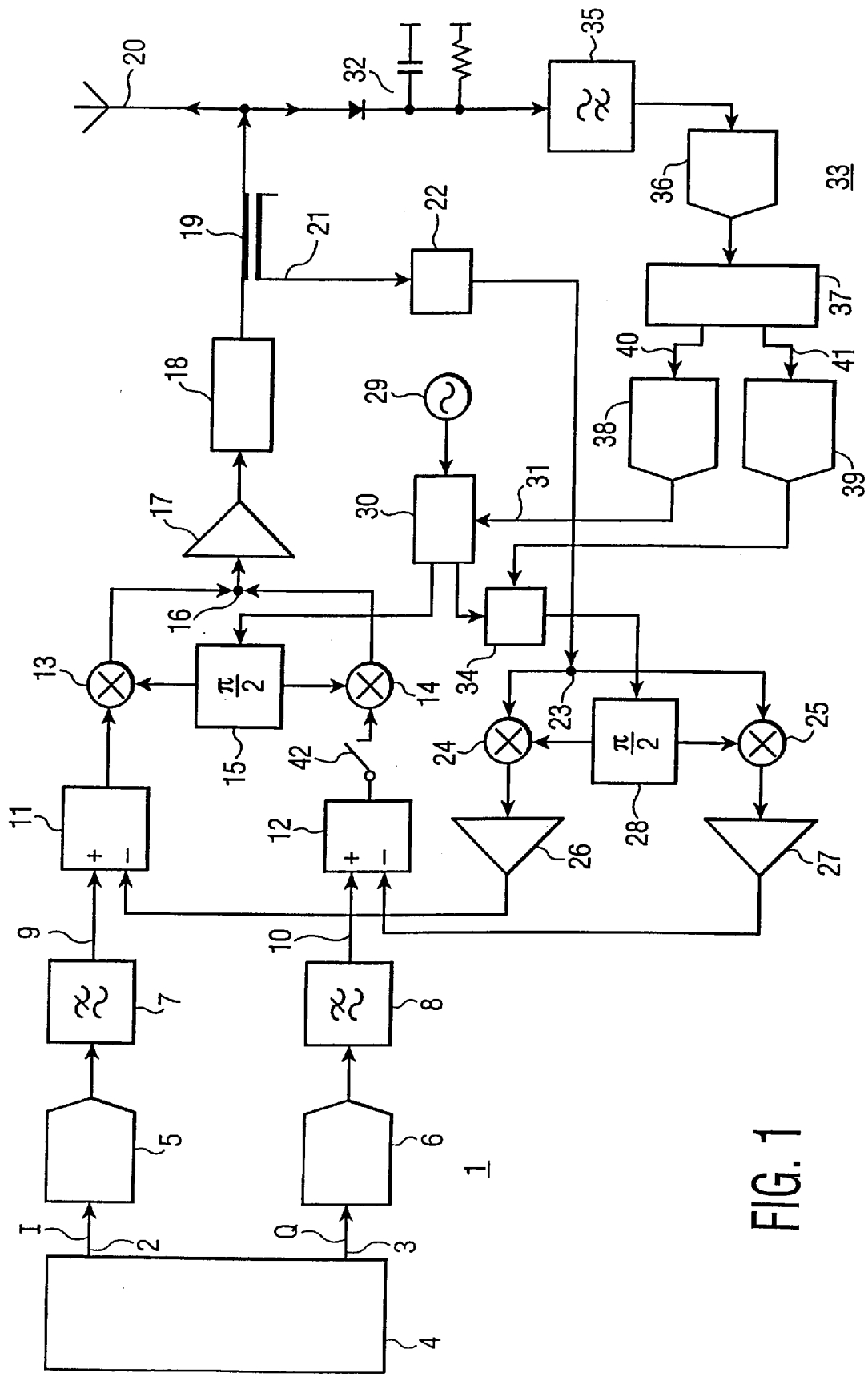
FIG. 1 shows an illustrative embodiment of the invention.

The circuit arrangement shown in FIG. 1 comprises a signal source 1 for producing an input signal, which input signal is rendered available in the form of two quadrature components I, Q. These quadrature components I, Q are provided on two respective outputs 2, 3 of a digital modulator 4 and applied each to a digital/analog converter 5, 6, respectively. The signals recovered from the quadrature components I, Q in the digital/analog converters 5, 6 are subsequently led through low-pass filter 7, 8 respectively and are rendered available on the low-pass filter outputs 9, 10 as analog quadrature components of the input signal of the signal source 1. In the present illustrative embodiment, the signal source 1 thus not only comprises the digital modulator 4, but also the digital/analog converters 5, 6 and the low-pass filter 7, 8.

From the output 9, 10, the quadrature components of the input signal are applied to non-inverting inputs of respective differential stages 11, 12 which together form a re-combining stage. The differential stages 11, 12 further have each an inverting input to which a quadrature component of a correction signal can be applied. In the differential stages of the re-combining stage a result signal is formed from the input signal and the correction signal by re-combining them component by component, and quadrature components of this result signal are provided on outputs of the differential stages 11, 12.

The quadrature components of the result signal are applied from the re-combining stage 11, 12 to a respective mixer 13, 14 of a first mixer stage. In the mixers 13, 14, the quadrature components of the result signal are mixed with two wave trains of a first oscillation of the local oscillator, phase shifted through 90° relative to each other by a phase shifter 15, and up-converted in the present embodiment. The quadrature components of the result signal, up-converted in this manner, travel from the mixers 13, 14 of the first mixer stage to a re-combining junction 16 at which said quadrature components are additively re-combined. The thus formed signal reaches a power amplifier stage 18 via a drive amplifier 17. The amplified signal is applied via a coupler 19 to the predominant part of an antenna 20 and radiated thereby.

The coupler 19 formed, for example, by a directional coupler, has an output 21 on which part of the output signal of the power amplifier 18 is provided as an outcoupling signal. This outcoupling signal from output 21 of the coupler 19 is applied to a feedback path for a derivation of the correction signal which is applied to the inverting inputs of the differential stages 11, 12 in the form of two quadrature components. For this purpose, the feedback path comprises an attenuator 22 for reducing the outcoupling signal (in so far as this reduction has not already been effected by appropriate power division in the coupler 19), a signal divider junction 23, two mixers 24, 25 forming a second mixer stage, and two driver amplifiers 26, 27. From the attenuator 22, the reduced outcoupling signal in the feedback path reaches, via the signal divider junction 23, the two mixers 24, 25 of the second mixer stage in-phase, in which mixers the outcoupling signal is remixed with two 90° phase-shifted wave trains of a second oscillation of the local oscillator, in the present example down-converted by the same frequency value as the result signal was up-converted in the first mixer stage 13, 14. The purpose of the driver amplifiers 26, 27 is to adapt the amplitude between the input signal and the correction signal and these amplifiers may be omitted, as appropriate. The wave trains of the second oscillations of the local oscillator phase shifted by 90° are recovered from these signals in a second phase shifter 28. The two oscillations of the local oscillator are derived from a local oscillator 29. The latter is thereto connected to a phase adjuster 30 in which the two oscillations of the local oscillator are derived from the waveform produced by the local oscillator 29 and the phase position of at least one of the oscillations of the local oscillator is adjusted by an adjusting signal which is applied to the phase adjustor 30 through an adjusting input 31. From two outputs of the phase adjuster 30, the first oscillation of the local oscillator is applied to the phase shifter 15 and the second oscillation of the local oscillator to the second phase shifter 28.

According to the invention, the circuit arrangement shown in FIG. 1 further includes an envelope curve detector 32, a control circuit 33 as well as a modulator 34. The envelope curve detector 32 is used in known manner for providing an envelope curve signal which corresponds to the envelope curve of the output signal of the power amplifier 18. The control circuit 33 comprises a high-pass filter 35 downstream of the envelope curve detector 32, an analog/digital converter 36, a digital signal processor 37 comprising digital means for evaluating the envelope curve signal, and two further digital/analog converters 38 and 39. The digital signal processor 37 is connected with its input to the envelope curve detector 32 via the analog/digital converter 36 and the high-pass filter 35; a first output 40 of the digital signal processor 37 is connected to the adjusting input 31 of the phase adjuster 30 via the digital/analog converter 38, while a second output 41 of the digital signal processor 37 is connected to the modulation stage 34 via the digital/analog converter 39.

The operation of the control circuit 33 and the modulation stage 34 will be further explained with reference to the diagram shown in FIG. 2. If the signal path for one of the quadrature components of the result signal (and thus of the input signal) in the represented Cartesian loop is interrupted in the circuit arrangement shown in FIG. 1, the effective feedback loop gain will be changed by the appearance of a phase error in the feedback loop. More particularly, the gain of the feedback path (22–27 in FIG. 1) will become dependent on the cosine of the phase error P of the feedback loop. The output amplitude of the power amplifier 18 of the antenna 20, and thus of the circuit arrangement of FIG. 1 is proportional to the reciprocal value of the gain of the feedback loop, so that the amplitude of the signal produced by the power amplifier 18 will become inversely proportional to the cosine of the phase error P of the feedback loop. Thus, for a predefined excitation of the Cartesian amplifier caused by a certain input signal, the smallest power level will appear when the phase of the feedback loop is adjusted to its correct value, when the phase error P of the feedback loop becomes zero.

These facts are utilized by the invention to regulate the phases of the feedback loop to their correct value. For this purpose, the envelope curve signal, produced by the envelope curve detector 32, can be simply minimized by adjusting the phase of the feedback loop. When this minimum is reached for the envelope curve of the carrier oscillation (FIG. 1: First oscillation of the local oscillator), the phase of the feedback loop is adjusted correctly.

Figure 2:
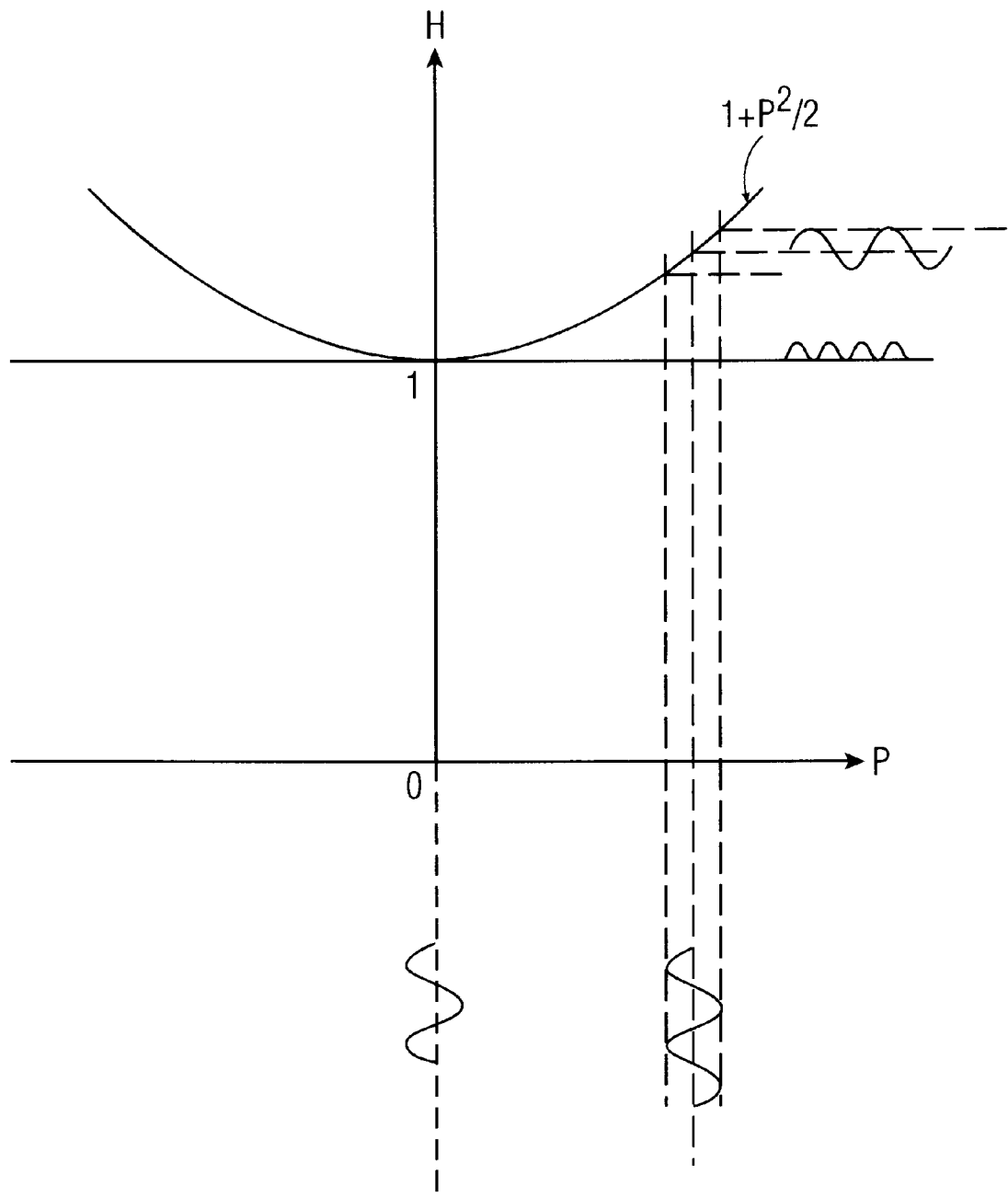
FIG. 2 shows a diagram for explaining the circuit arrangement shown in FIG. 1.

In practice, it appears that for the envelope curve detector 32 and the control circuit 33 it is necessary to have a very high amplitude resolution, because the maximum permissible value for the phase error P of the feedback loop only leads to minor changes in the signal amplitude on the output of the power amplifier 18 and thus in the envelope curve signal (referenced H in FIG. 2). For example, a 5° phase error P of the feedback loop produces an increase of the envelope curve signal H by only 0.38%. Especially in the audio/digital converter 36 in FIG. 1, a high resolution is necessary for a direct sampling of the envelope curve signal H to measure the resulting amplitude changes accurately enough.

According to the invention, for adjusting the phase of the feedback loop, this phase is modulated by a certain value around its normal value. If the nominal value i.e. the feedback loop phase value that has just been adjusted, as it appears in FIG. 1 particularly from the phase regulator as it is adjusted by the adjusting signal on input 31, is erroneous, said modulation of the phase of the feedback loop will take place via an amplitude modulation of the envelope curve of the output signal of the power amplifier 18, and thus via an amplitude modulation of the envelope curve signal H. The modulation depth is then directly proportional to the phase error P of the feedback loop, and this can be directly measured by evaluating the envelope curve signal. As this necessitates the evaluation of the AC component of the envelope curve signal, advantageously only an AC coupling is effected from the envelope curve detector 32 to the control circuit 33. In the illustrative embodiment shown in FIG. 1, the high-pass filter is used therefor. This filter does away with the necessity of resolving slight differences in DC current levels, so that changes of the envelope curve signal H can be detected. As a result, the requirements as to circuitry of the analog/digital converters are kept within boundaries.

The amplitude of the envelope signal H having the frequency of the above-mentioned modulation of the phase of the feedback loop is directly proportional to the mean value of the phase error P of the feedback loop when averaged over a period of this phase modulation. When the phase error P of the feedback loop becomes zero, the envelope curve detector 32 will produce a signal at twice the frequency of the modulation when the above-mentioned phase modulation frequency (frequency with which the phase is modulated for above measuring purposes) is used. This can easily be detected from the diagram in FIG. 2, which shows in standardized form the envelope curve signal H above the phase error P of the feedback loop for the Cartesian amplifier shown in FIG. 1. As is described, the envelope curve signal H is inversely proportional to the cosine of phase error P of the feedback loop. For small values of P, this reciprocal value of the cosine function can be approximated by the function $1+P^2/2$ shown. This expression becomes 1, if P becomes zero. The relative standarized rise of amplitude of the envelope curve signal H is thus approximately $P^2/2$. The square-law variation of this function means that for slight variations of the phase of the feedback loop according to the modulation described above, the value of the amplitude modulation generated thereby rises linearly with the phase error P of the feedback control. This is because the rise of the square-law function is directly proportional to P.

This fact can also be made use of for adjusting the phase of the feedback loop automatically by a simple control loop which includes the envelope curve detector 32. The square-law dependence of the envelope circuit signal H on the phase error P of the feedback loop means that the phase of the envelope curve signal for positive loop phase errors is different from the phase for negative loop phase errors. When comparing the phase of the envelope curve signal H with the phase of the modulation signal with which the phase of the feedback loop is modulated, there may be directly established that the phase error P is either positive or negative. Such a phase comparison may be effected in an analog multiplier, or by digital means, for example, the digital signal processor 37 in the control circuit 33. the result of this comparison may then be used for controlling the nominal phase of the feedback loop. Preferably, this control loop may comprise an intergrator or an integrating control function to ensure that the loop settles with a zero error.

In FIG. 1, the digital signal processor 37 is used for generating a digital measuring signal on its second output 41, from which signal analog measuring oscillation is formed in the subsequent digital/analog converter 39. The output of the digital/analog converter 39 forms a modulation output from which the measuring oscillation is applied to the modulator 34. In the modulator 34, the phase position of the second oscillation of the local oscillator, on its way from the phase adjustor 30 to the second phase shifter 28, is modulated in the described manner with a predefined frequency (with the frequency of the measuring oscillation) by a predefined value. The resulting amplitude modulation of the envelope curve signal is evaluated by the digital signal processor 37 (applied through the analog/digital converter 36). In accordance with the rules described, the digital signal processor 37 generates a digital adjusting signal on its first output 40, which signal is converted in the subsequent digital/analog converter 38 into an analog adjusting signal. The output of the digital/analog converter 38 thus forms an adjusting output of the control circuit 33. The analog adjusting signal is applied from this adjusting output to the adjusting inputs 31 of the phase adjustor 30. In the phase adjuster 30 the adjusting signal adjusts the phase of at least either oscillation of the local oscillator. For example, only the first or the second oscillation of the local oscillator can be adjusted, but the two may also be adjusted in opposite directions etc.

FIG. 2 shows two cases of a modulation of the phase of the feedback loop. In the first case, the phase is modulated by a nominal value which is situated P=0. Accordingly, there is no or substantially no modulation of the envelope curve signal H at the loop phase modulation frequency. In the second case, a non-zero phase error P of the feedback loop occurs. If the phase of the feedback loop is modulated around this value, the result will be a modulation of the envelope curve signal H.

The measuring oscillation is preferably generated during a predefinable time interval in which the signal source 1 produces an input signal with a predefined time delay. During this time interval, a switch 42 interrupts, preferably in the circuit arrangement shown in FIG. 1, the signal path for the quadrature components Q of the result signal between the differential stage 12 and the mixer 14. During operation, when a valid signal travels from the signal source 1 to the antenna 20, the switch is conductive. The phase value of the feedback loop reached during second time interval is stored in this digital signal processor 37 for the operation with the valid signal i.e. the value reached for the digital adjusting signal is stored.

In addition to the described phase control of the feedback loop, the envelope curve signal H may also be used as a measuring signal for controlling the gain balance VG, the quadrature error QF and the DC shift DCQ or DCI respectively, which result from carrier residual in the quadrature components of the signal to be amplified in the Cartesian amplifier. Since all these measuring quantities are orthogonal to each other in terms of high-frequency measurements, they may be recovered simultaneously from one and the same envelope curve signal H. This allows a high speed and efficiency evaluation of the envelope curve signal and thus a high speed adjustment of the Cartesian loop.

Figure 3:
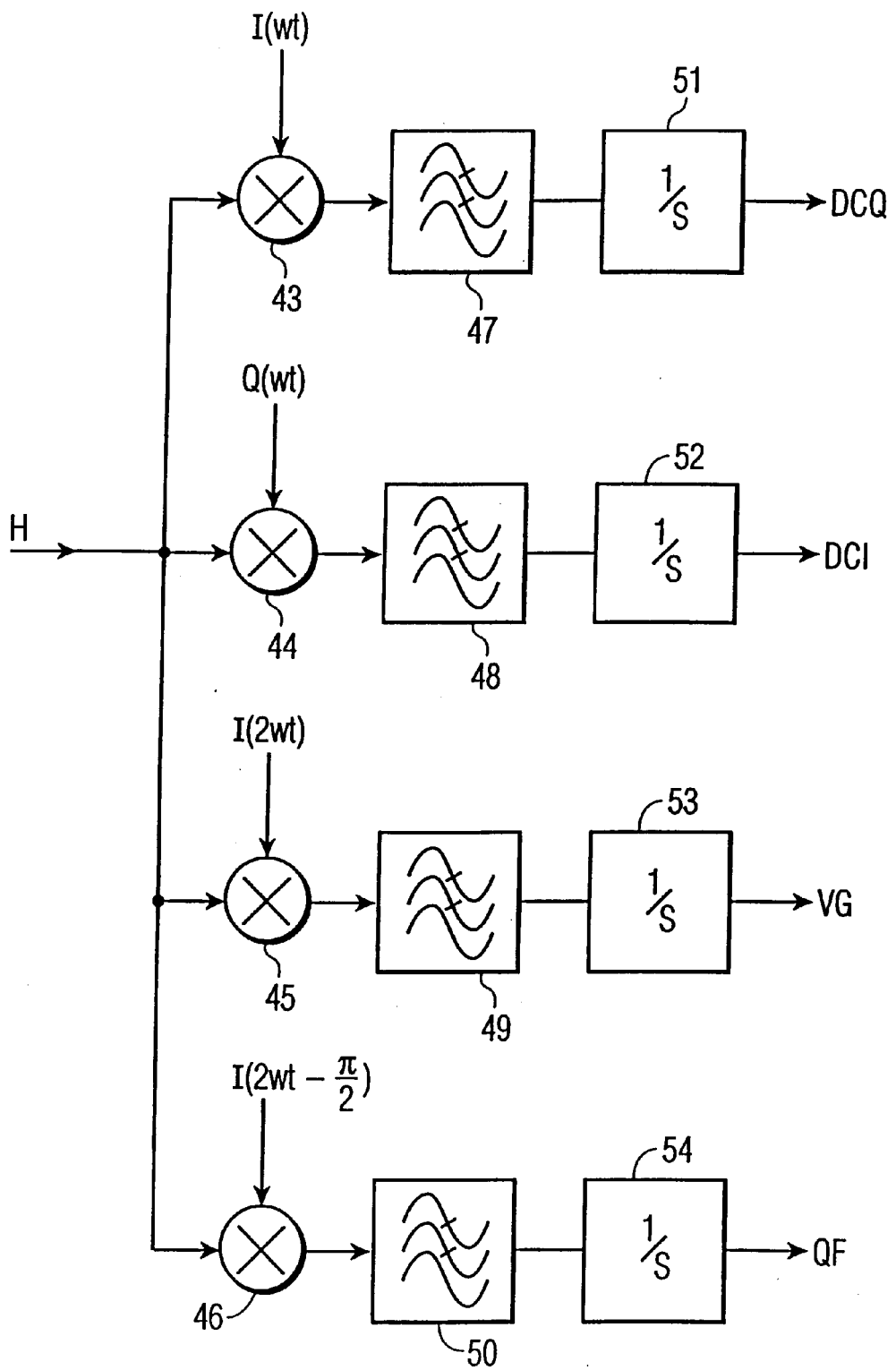
FIG. 3 shows a first modification of the illustrative embodiment shown in FIG. 1.

FIG. 3 shows in a diagram an example for an analog circuit arrangement for multiple evaluation of the envelope curve signal H. This signal is applied to the first inputs of four mixers 43, 44, 45, 46 and mixed therein with oscillations derived from the quadrature components I or Q with the frequency of a test modulation source 37, 39 (FIG. 1) (angular frequency ω) or with twice this frequency, while the oscillations having twice said frequency are phase shifted to each other by 90°. Time is referenced t there.

The consequent oscillations are filtered and subsequently integrated in integrators 51, 52, 53 and 54 by the respective low-pass filters 47, 48, 49 and 50 following the mixers 43 to 46. The measuring quantities are simultaneously available for evaluation on the outputs of the integrators. This evaluation may be effected, for example, in the digital signal processor 37 shown in FIG. 1, so that a high-performance and compact control arrangement arises. The arrangement shown in FIG. 3 may also be designated a coherent detector.

Figure 4:
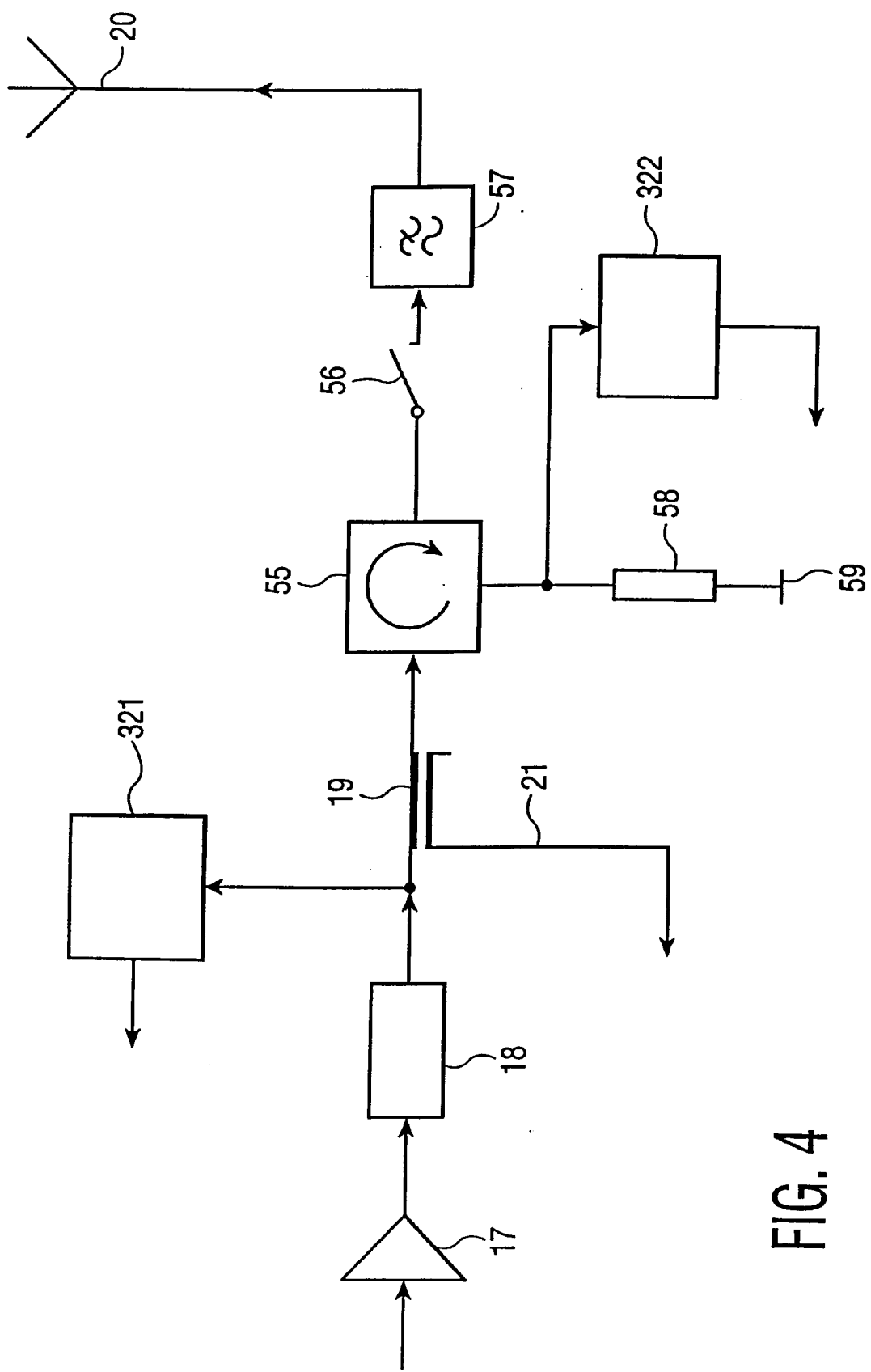
FIG. 4 shows a second modification of the illustrative embodiment shown in FIG. 1.

Albeit, according to aforesaid embodiments, only a single envelope curve detector is needed, it may be useful connecting this detector differently to the signal path from the power amplifier 18 to the antenna 20 (or to a comparable signal path at the output of the power amplifier 18). In this respect FIG. 4 shows two embodiments as a modification of a part of the FIG. 1 which, for reasons of simplicity, is represented only as a section. Like elements already described, carry like references. In FIG. 4 is inserted between the coupler 19 and the antenna 20 a circulator 55, a switch 56 and a low-pass filter 57 which has a high limit-frequency for suppressing top oscillations of the transmission frequency (i.e. of the carrier frequency or the frequency of the oscillation of the local oscillator). The switch is used for disconnecting the antenna, as required. A third connection of the circulator 55 is grounded at 59 via a load resistor 58. A first envelope curve detector 321, and a second envelope curve detector 322, parallel with the load resistor 58, are connected to the output of the power amplifier 18. The first envelope curve detector 321 is preferred for a so-called envelope curve feedback, whereas the second envelope curve detector 322 is preferred for a VSWR feedback (VSWR is to be understood to mean Voltage-to-Standing Wave Ratio). One of these envelope curve detectors may preferably be used in an analog control circuit, the other in a digital control circuit as shown in FIG. 1.

I claim:

1. A circuit arrangement comprising a Cartesian amplifier, including
    a signal source for producing an input signal,
    a re-combining stage for forming a result signal by re-combining the input signal and a correction signal,
    a first mixer stage for mixing the result signal with a first oscillation of the local oscillator,
    a power amplifier stage for amplifying the signal produced by the first mixer stage,
    a coupler for coupling out part of the output signal of the power amplifier stage as an outcoupling signal,
    a feedback path comprising a second mixer stage for deriving the correction signal from the outcoupling signal by mixing the outcoupling signal with a second oscillation of the local oscillator,
    an envelope curve detection stage for producing an envelope curve signal which corresponds to the envelope curve of the output signal of the power amplifier stage,
    and a phase adjustment stage for adjusting the phase position of at least one of the oscillations of the local oscillator, characterized by
    a control circuit having
        an input for receiving the envelope curve signal,
        an adjustment output, from which an adjusting signal for adjusting the phase position of at least one of the oscillations of the local oscillator is applied to the phase adjustment stage, and
        a modulation output for producing a measuring oscillation,
        and a modulation stage for modulating the phase position of one of the oscillations of the local oscillator with the measuring oscillation,
    which control circuit minimizes from the envelope curve signal the signal portion that results from the modulation with the measuring oscillation, by adjusting the phase position of at least one of the oscillations of the local oscillator by means of the adjusting signal.

2. A circuit arrangement as claimed in claim 1, characterized in that the control circuit comprises a high-pass filter connected to its input for isolating the signal part resulting from the modulation with the measuring oscillation from the envelope curve signal.

3. A circuit arrangement as claimed in claim 1, characterized in that the control circuit comprises digital switching means for evaluating the envelope curve signal and producing the measuring oscillation and the adjusting signal.

4. A circuit arrangement as claimed in one of the preceding claims, characterized in that the envelope curve signal is simultaneously used for controlling further operating parameters and/or tuning operations of the Cartesian amplifiers.

5. A circuit arrangement as claimed in claim 1, characterized in that the measuring oscillation is generated during a predefinable time interval while the signal source produces an input signal with a predefined time delay, and in that outside this time interval the value of the adjusting signal reached in this very time interval is retained by the control circuit.

6. A circuit arrangement as claimed in claim 1, characterized in that the input signal is provided in the form of Cartesian signal components by the signal source and in that the re-combining stage and the mixers have different signal paths for these or associated signal components.

7. A transmitter apparatus comprising a circuit arrangement as claimed in claim 1.

8. Mobile radio equipment comprising a transmitter apparatus as claimed in claim 7.

* * * * *